US008482108B2

(12) United States Patent
Park et al.

(10) Patent No.: US 8,482,108 B2
(45) Date of Patent: Jul. 9, 2013

(54) WAFER-SCALE X-RAY DETECTOR AND METHOD OF MANUFACTURING THE SAME

(75) Inventors: Jae-chul Park, Suwon-si (KR); Chang-jung Kim, Yongin-si (KR); Sang-wook Kim, Yongin-si (KR); Sun-il Kim, Osan-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 155 days.

(21) Appl. No.: 13/109,435

(22) Filed: May 17, 2011

(65) Prior Publication Data

US 2012/0146016 A1    Jun. 14, 2012

(30) Foreign Application Priority Data

Dec. 10, 2010   (KR) ................. 10-2010-0126356

(51) Int. Cl.
*H01L 31/115* (2006.01)
(52) U.S. Cl.
USPC ............. 257/660; 257/186; 257/E31.086
(58) Field of Classification Search
CPC ............................................ H01L 2924/3025
USPC ........... 257/66, 186, 293, E31.086, E31.092, 257/E27.14, E27.146, E33.076, E31.115, 257/E31.121; 438/7, 16, 27, 66, 73
See application file for complete search history.

(56) References Cited

U.S. PATENT DOCUMENTS

| | | | |
|---|---|---|---|
| 6,759,262 B2 * | 7/2004 | Theil et al. ................. | 438/48 |
| 7,189,971 B2 * | 3/2007 | Spartiotis et al. ........ | 250/370.09 |
| 7,339,246 B2 | 3/2008 | Nascetti et al. | |
| 7,436,038 B2 * | 10/2008 | Engelmann et al. ......... | 257/444 |
| 2004/0036010 A1 * | 2/2004 | Hsieh et al. ................ | 250/208.1 |
| 2004/0135209 A1 * | 7/2004 | Hsieh et al. .................. | 257/368 |
| 2004/0195640 A1 | 10/2004 | Nascetti et al. | |
| 2006/0249765 A1 * | 11/2006 | Hsieh ............................ | 257/292 |
| 2011/0241143 A1 * | 10/2011 | Kim et al. .................... | 257/428 |
| 2012/0056289 A1 * | 3/2012 | Tian et al. ..................... | 257/431 |

* cited by examiner

*Primary Examiner* — Cuong Q Nguyen
*Assistant Examiner* — Yosef Gebreyesus
(74) *Attorney, Agent, or Firm* — Harness, Dickey & Pierce, P.L.C.

(57) ABSTRACT

A wafer-scale x-ray detector and a method of manufacturing the same are provided. The wafer-scale x-ray detector includes: a seamless silicon substrate electrically connected to a printed circuit substrate; a chip array having a plurality of pixel pads formed on a central region thereof and a plurality of pin pads formed at edges thereof on the seamless silicon substrate; a plurality of pixel electrodes formed to correspond to the pixel pads; vertical wirings and horizontal wirings formed to compensate a difference of regions expanded towards the pixel electrodes from the pixel pads between the chip array and the pixel electrodes; a redistribution layer having an insulating layer to separate the vertical wirings and the horizontal wirings; and a photoconductor layer and a common electrode which cover the pixel electrodes on the redistribution layer.

29 Claims, 7 Drawing Sheets

WAFER-SCALE X-RAY DETECTOR AND METHOD OF MANUFACTURING THE SAME

CROSS-REFERENCE TO RELATED APPLICATIONS

This application claims priority under 35 U.S.C. §119 to Korean Patent Application No. 10-2010-0126356, filed on Dec. 10, 2010, in the Korean Intellectual Property Office (KIPO), the disclosure of which is incorporated herein in its entirety by reference.

BACKGROUND

1. Field

Example embodiments relate to wafer-scale x-ray detectors that realize seamless images and methods of manufacturing the same.

2. Description of the Related Art

A digital x-ray detector outputs a digital signal in response to an x-ray image or an x-ray fluoroscopy image taken by x-rays. Such an X-ray detector can operate via a direct method or an indirect method.

In the direct method, x-rays are directly converted into an electrical charge in a photoconductor. In the indirect method, after converting x-rays into a visible light in a scintillator, the visible light is converted into an electrical charge through a photoelectric conversion device such as a photodiode.

The direct method x-ray detector includes a plurality of pixel electrodes formed under a photoconductor layer, and a signal processing unit that processes an electrical signal transmitted from the pixel electrodes.

In order to manufacture a large-scale x-ray detector using a conventional direct method, a photoconductor layer is formed on an application-specific integrated circuit (ASIC). Therefore, when ASICs having the photoconductor layer are tiled in a large scale, a part of an image is not detected at a seam region due to a seam between the ASICs. In particular, seams having a size of 100 μm or above can be formed when the ASICs are tiled, thus, tissues in these seams may not detected.

SUMMARY

Example embodiments provide a wafer-scale x-ray detector that realizes a seamless imaging field using a chip array manufactured in a wafer-scale and a method of manufacturing the same. Additional aspects will be set forth in part in the description which follows and, in part, will be apparent from the description, or may be learned by practice of example embodiments.

In accordance with example embodiments, a wafer-scale x-ray detector may include a seamless silicon substrate, a first plurality of pixel pads and a first plurality of pin pads on a first surface of the seamless silicon substrate, a second plurality of pixel pads and a second plurality of pin pads on the first surface of the seamless silicon substrate, a photoconductor layer on the first and second pluralities of pixel pads and the first and second pluralities of pin pads, a plurality of pixel electrodes between the photoconductor layer and the first and second pluralities of pixel pads and between the photoconductor layer and the first and second pluralities of pin pads, a printed circuit substrate on a second surface of the seamless silicon substrate, and a common electrode on the photoconductor layer on which x-rays are irradiated. In example embodiments, the first plurality of pixel pads and the first plurality of pin pads may define a first chip region and the second plurality of pixel pads and the second plurality of pin pads may define a second chip region.

In example embodiments, a method of manufacturing an x-ray detector may include forming a plurality of chip regions each having a plurality of pixel pads and a plurality of pin pads on a first surface of a seamless silicon substrate, forming a plurality of first via holes through the seamless silicon substrate to expose the pluralities of pin pads, bonding a printed circuit substrate on a second surface of the seamless silicon substrate by electrically connecting the pluralities of pin pads to the printed circuit substrate through the plurality of first via holes, and sequentially forming pixel electrodes electrically connected to the pluralities of pixel pads, a photoconductor layer on the pixel electrodes, and a common electrode on the photoconductor layer.

In accordance with example embodiments, a wafer-scale x-ray detector may including a seamless silicon substrate having a plurality of chip regions on a surface thereof, a photoconductor layer formed above the surface of the seamless silicon substrate, a plurality of pixel electrodes formed between the surface of the seamless silicon substrate and the photoconductor layer, a printed circuit substrate disposed to correspond to the other surface of the seamless silicon substrate, and a common electrode that is formed on the photoconductor layer and onto which x-rays are irradiated, wherein each of the chip regions includes a plurality of pixel pads and a plurality of pin pads.

The wafer-scale x-ray detector may further include a redistribution layer that electrically connects the pixel pads and the pin pads.

The redistribution layer may include at least one insulating layer and vertical wirings that penetrate through the insulating layer and horizontal wirings.

In example embodiments, an area covered by the pixel electrodes corresponding to the plurality of the pixel pads may be greater than an area covered by the plurality of the pixel pads.

The plurality of the pin pads may be disposed to surround the plurality of the pixel pads, and the plurality of the pin pads and the plurality of the pixel pads may be electrically connected to each other.

In accordance with example embodiments, the wafer-scale x-ray detector may further include a plurality of via holes on the seamless silicon substrate, wherein each pin pad is electrically connected to the printed circuit substrate through via contacts.

The wafer-scale x-ray detector may further include bumps disposed between the via contacts and the printed circuit substrate, wherein the bumps electrically connect the via contacts and the printed circuit substrate.

In accordance with example embodiments, the wafer-scale x-ray detector, may further include a plurality of via holes formed on the seamless silicon substrate and via contacts on corresponding via holes, wherein each contact is electrically connected to a metal formed through each of the pin pads.

The printed circuit substrate may be a single printed circuit substrate, and may be disposed to correspond to the plurality of the chip regions.

In example embodiments, the printed circuit substrate may include a plurality of printed circuit substrates, and each of the plurality of the printed circuit substrates may be disposed in a one-to-one correspondence with each of the plurality of the chip regions.

The wafer-scale x-ray detector may further include a resin filled in a gap between the seamless silicon substrate and the printed circuit substrate.

The seamless silicon substrate may be formed of monocrystalline silicon.

The photoconductor layer may be formed of at least one material selected from the group consisting of amorphous selenium (a—Se), $HgI_2$, $PbI_2$, CdTe, CdZnTe, and PbO.

In accordance with example embodiments, a method of manufacturing an x-ray detector may include forming a plurality of chip regions each having a plurality of pixel pads and a plurality of pin pads on a surface of a seamless silicon substrate, forming via holes on another surface of the seamless silicon substrate to expose the pin pads, bonding a printed circuit substrate on the another surface of the seamless silicon substrate by electrically connecting the pin pads to the printed circuit substrate through the via holes, and sequentially forming pixel electrodes electrically connected to the pixel pads, a photoconductor layer, and a common electrode.

The method may further include forming a redistribution layer that electrically connects the pixel pads to the pixel electrodes.

The forming of the redistribution layer may include forming a first insulating layer that includes vertical wirings that contact the pixel pads and forming a second insulating layer on the first insulating layer, the second insulating layer comprising horizontal wirings and vertical wirings that expand an area of the pixel electrodes corresponding to an area of the pixel pads.

The forming of the first insulating layer may include forming the first insulating layer on the pixel pads, forming the via holes connected to the pixel pads in the first insulating layer, and forming the vertical wirings by filling the via holes with a metal.

The forming of the second insulating layer may include forming the horizontal wirings to be connected to the vertical wirings in the first insulating layer, forming an insulating layer on the first insulating layer and the horizontal wiring, forming the via holes in the second insulating layer, the via holes connected to the horizontal wirings, and forming the vertical wirings by filling the via holes with a metal.

The bonding of the printed circuit substrate may include the bonding of the printed circuit substrate on the another surface of the seamless silicon substrate after forming via contacts on the via holes.

The method may further include forming bumps between the via contacts and the printed circuit substrate after the forming of the via contacts and before bonding the printed circuit substrate, wherein the via contacts are connected to the printed circuit substrate through the bumps.

The printed circuit substrate may be a single printed circuit substrate corresponding to the plurality of the chip regions.

The printed circuit substrate may include a plurality of printed circuit substrates disposed to correspond one-to-one with each of the plurality of the chip regions.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
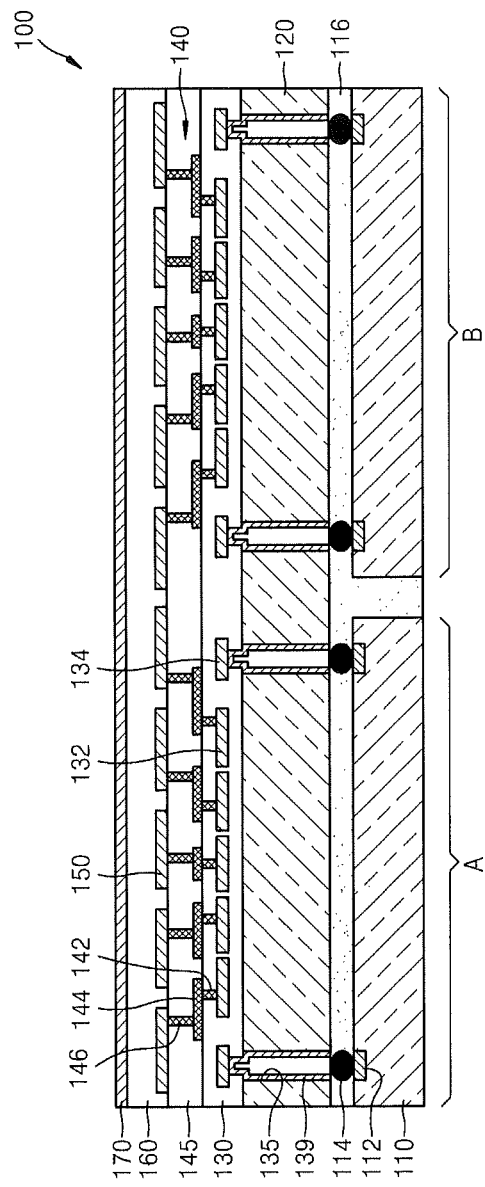
FIG. 1 is a schematic cross-sectional view of a wafer-scale x-ray detector according to example embodiments.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made in detail to example embodiments as illustrated in the accompanying drawings, wherein, in the drawings, the thicknesses of layers and regions are exaggerated for clarity of the specification and like reference numerals refer to substantially like elements throughout.

FIG. 1 is a schematic cross-sectional view of a wafer-scale x-ray detector 100 according to example embodiments.

Referring to FIG. 1, the wafer-scale x-ray detector 100 includes a silicon substrate 120 on a printed circuit substrate 110. A lower surface of the silicon substrate 120 may include via contacts 139 electrically connected to contacts 112 formed on the printed circuit substrate 110. A bump 114 may be formed between the contacts 112 of the printed circuit substrate 110 and the via contacts 139 to electrically connect the contact 112 and the via contacts 139.

A plurality of chip regions forms an array on the silicon substrate 120. In FIG. 1, only two chip regions A and B are depicted for convenience. A plurality of pixel pads 132 may be formed in a central region of each of the chip regions A and B, and pin pads 134 that surround the pixel pads 132 may be formed on edges of the chip regions A and B. Each of the pixel pads 132 may be connected to a corresponding pin pad 134 by a wire (not shown). A first insulating layer 130 may be formed on the silicon substrate 120 to insulate the pixel pads 132 and the pin pads 134 from the silicon substrate 120. The pixel pads 132, the pin pads 134, and the silicon substrate 120 of each of the chip regions A and B constitute a chip, and the chips constitute a chip array.

Figure 2:
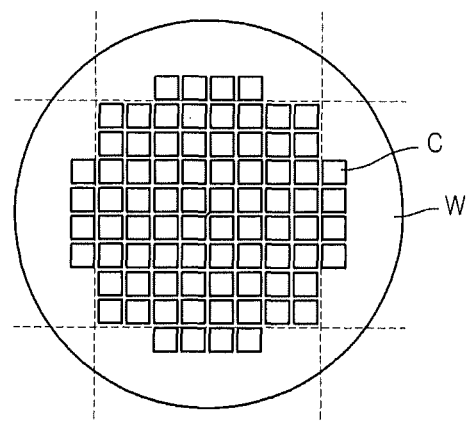
FIGS. 2 and 3 are plan views for explaining a chip array of a wafer-scale x-ray detector according to example embodiments.
Figure 3:
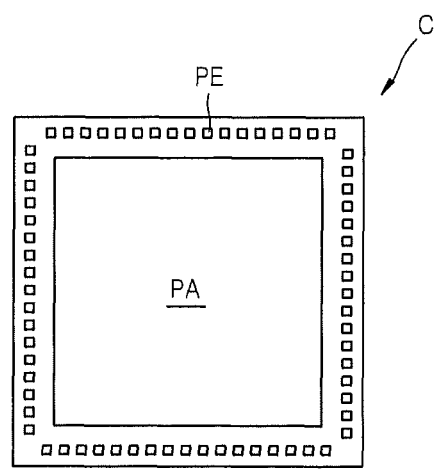

The chip array may be formed by cutting a single wafer to be suitable for an x-ray detector. FIGS. 2 and 3 are plan views for explaining the chip array of a wafer-scale x-ray detector 100 according to example embodiments.

Referring to FIG. 2, a plurality of chips C may be disposed on a silicon wafer W. Each of the chips C may correspond to the chip region described above. In order to be used in the wafer-scale x-ray detector 100, the silicon wafer W may be cut along the dotted cutting lines. Accordingly, remaining chips C by the cutting may form a chip array of a single silicon wafer (or a single silicon substrate) without a seam.

FIG. 3 is a plan view of one of the chips C of FIG. 2. A plurality of pixel pads (referring to 132 in FIG. 1) and pin pads PE (referring to 134 in FIG. 1) that surround the pixel pads 132 are formed in a single chip C, and the pixel pads 132 and the pin pads PE may be electrically connected to each other. The pixel pads 132 are simply depicted as a pixel region PA. The pixel pads 132 and the pin pads PE corresponding to the pixel pads 132 may be connected to each other by wirings of a redistribution layer 140 which will be described later.

Referring to FIG. 1 again, a plurality of printed circuit substrates 110 may be correspondingly disposed to a single silicon substrate 120 on which a chip array is formed. In FIG. 1, only two printed circuit substrates 110 are depicted for convenience of explanation. However, a single printed circuit substrate 110 may be disposed to correspond to the single silicon substrate 120.

Each of the pin pads 134 may be connected to the via contact 139 formed in a via hole 135 of the silicon substrate 120, and the via contact 139 may be electrically connected to the contact 112 of the printed circuit substrate 110 through a bump 114 disposed on an end of the via contact 139.

A resin 116, for example, an epoxy resin may be deposited between the printed circuit substrate 110 and the seamless silicon substrate 120 to support them.

Figure 4:
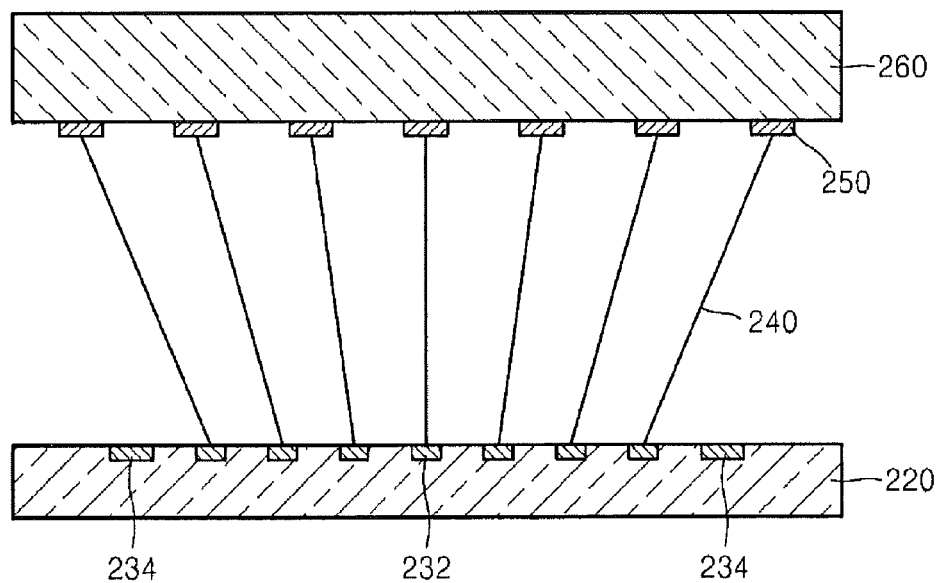
FIG. 4 is a schematic conceptual drawing for explaining the electrical connection between pixel electrodes and a chip array in a wafer-scale x-ray detector according to example embodiments.

The redistribution layer 140 that connects the pixel pads 132 and pixel electrodes 150, which will be described later, may be formed on the first insulating layer 130. The redistribution layer 140 may connect the pixel electrodes 150 and the pixel pads 132 corresponding to the pixel electrodes 150, and since the pixel electrodes 150 are spread over the entire chip region; the pixel pads 132 may be disposed in a central region of each of the chip regions, thus the pixel electrodes 150 may be electrically connected to the pixel pads 132 as depicted in FIG. 4. The redistribution layer 140 may expand an area of the pixel electrodes 150 corresponding to an area of the pixel pads 132.

The redistribution layer 140 may include the first insulating layer 130 and insulating layer 145 formed on the chip array, and vertical wirings 142 and 146 and a horizontal wiring 144 formed on and/or through the insulating layers 130 and 145.

The seamless silicon substrate 120 may be a mono-crystalline silicon wafer. A circuit formed on mono-crystalline silicon may have a relatively high operation speed and relatively low noise, may increase speed for processing an electrical signal transferred from a photoconductor, and transmit the processed electrical signal to the printed circuit substrate 110.

Each of the chip regions may be formed in a maximum size of approximately 2 cm×2 cm due to a limit of a mask used in semiconductor processes. Approximately a few tens of thousands to a few hundreds of thousands of pixel pads 132 and pin pads 134 may be formed in a single chip region.

In the printed circuit substrate 110, an image signal may be realized by measuring the x-ray transmittance of an object to be measured using an inputted electrical signal.

An epoxy resin 116 may fill a gap between the printed circuit substrate 110 and the seamless silicon substrate 120 to fix them.

An x-ray detection unit that includes a photoconductor layer 160 may be disposed on the redistribution layer 140. The photoconductor layer 160 covering the pixel electrodes 150 may be formed to a single material layer. The photoconductor layer 160 may be formed of a material selected from the group consisting of amorphous selenium (a—Se), $HgI_2$, $PbI_2$, CdTe, CdZnTe, and PbO.

A thickness of the photoconductor layer 160 may vary according to an object to be measured. For example, if the photoconductor is formed of $HgI_2$, when a chest is measured, the thickness of the photoconductor layer 160 may be in a range from about 500 μm to about 600 μm, and when a breast is measured, the thickness of the photoconductor layer 160 may be in a range from about 300 μm to about 400 μm. Also, if the photoconductor layer 160 is formed of a—Se, when a chest is measured, the thickness of the photoconductor layer 160 may be in a range from about 900 μm to about 1,000 μm, and when a breast is measured, the thickness of the photoconductor layer 160 may be in a range from about 300 μm to about 400 μm.

The photoconductor layer 160 may generate charges according to the intensity of an x-ray inputted above it. The photoconductor layer 160 may be divided into a plurality of seamless pixel regions, and a pixel electrode 150 may be formed on a lower side of each of the pixel regions to convert charges collected from each of the pixel regions to an electrical signal. The electrical signal may be transmitted to the via contact 139 of a corresponding pixel pad 132.

A continuous common electrode 170 may be formed on the photoconductor layer 160. An electric field may be formed in the photoconductor layer 160 according to a direct current voltage applied to the common electrode 170, and a hole or an electron of a pair of hole-electron formed in the photoconductor layer 160 may move to each of the pixel electrodes 150. A type of the charge from the photoconductor layer 160 to the pixel electrode 150 may vary according to the material for forming the photoconductor layer 160, and accordingly, a positive voltage or a negative voltage may be applied to the common electrode 170 according to the type of the charge.

The pixel electrodes 150 may be connected to the corresponding pixel pads 132 through the horizontal wiring 144 and the vertical wirings 142 and 146. The horizontal wiring 144 will be described with reference to FIG. 4. Hereinafter, the horizontal wiring 144 will also be referred to as a connection wiring.

FIG. 4 is a schematic conceptual drawing for explaining the electrical connection between pixel electrodes 250 and a chip array 220 in a wafer-scale x-ray detector according to example embodiments. In FIG. 4, only one single chip region and the pixel electrodes 250 are depicted for convenience of explanation.

Referring to FIG. 4, the chip array 220 may include pixel pads 232 disposed in a central chip region thereof, and pin pads 234 that correspond to the pixel pads 232 and may be disposed to surround the pixel pads 232. In example embodiments, an area occupied by the pixel pads 232 in the chip region may be smaller than that of the corresponding pixel electrodes 250. Therefore, in order to connect the corresponding pixel electrodes 250 and the pixel pads 232 of the chip array 220 using all of the x-ray incident-area of the photoconductor layer 260, connection wirings 240 may be slantly connected as shown in FIG. 4, or may be connected by using horizontal or vertical wirings (refer to FIGS. 5B, 5D, 5E, 5F, and 6B).

In the x-ray detector of FIG. 1, the pixel pads 132 and the pixel electrodes 150 are electrically connected by using the redistribution layer 140. Therefore, charges detected in the entire region of the photoconductor layer 160 including gaps between neighboring chip regions are redistributed and transferred to the pixel pads 132. Accordingly, a seamless image in an imaging field can be correctly realized.

Also, since a wafer-scale chip array is used, a wide seamless chip region is uniformly distributed. Accordingly, the chip array and the pixel pads can be readily connected.

FIGS. 5A through 5F are cross-sectional views for explaining a method of manufacturing the structure of the x-ray detector of FIG. 1, in accordance with example embodiments.

Figure 5A:
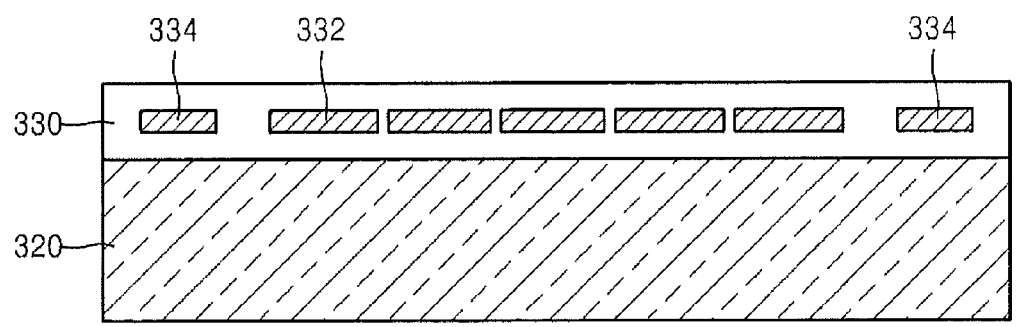
FIGS. 5A through 5F are cross-sectional views for explaining a method of manufacturing the structure of the x-ray detector of FIG. 1, according to example embodiments.

Referring to FIG. 5A, a plurality of chip regions having pixel pads 332 formed on a central region in each of the chip regions (refer to A and B in FIG. 1), pin pads 334 that surround the pixel pads 332 on edges of each of the chip regions, a first insulating layer 330 that surrounds the pixel pads 332 and the pin pads 334 may be formed on a silicon wafer 320. Each of the chip regions may include a few tens of thousands of pixel pads 332 and the pin pads 334 as many as the pixel pads 332. In FIG. 5A, a chip region having five pixel pads 332 and two pin pads 334 is depicted for convenience of explanation. Wires connecting corresponding pixel pads 332 and pin pads 334 are not shown. The first insulating layer 330 may insulate the pixel pads 332 and the pin pads 334 from the silicon wafer 320.

Figure 5B:
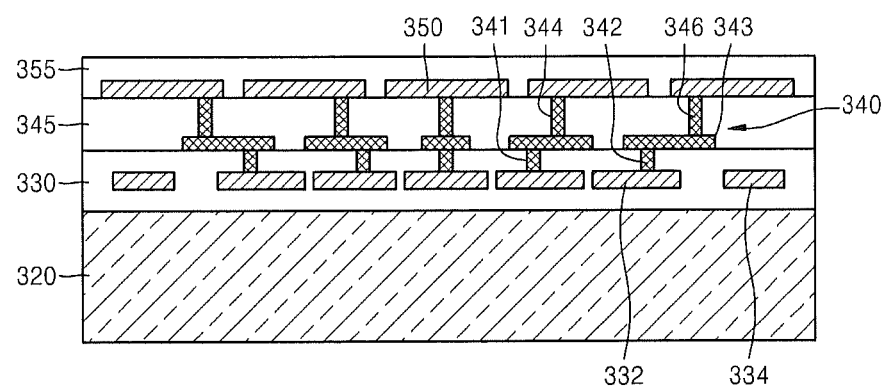

Referring to FIG. 5B, each of the pixel pads 332 may be exposed by forming via holes 341 corresponding to the pixel pads 332 in the first insulating layer 330, and afterwards, vertical wirings 342 may be formed by filling the via holes 341 with a metal. In example embodiments, horizontal wirings 343 connected to the vertical wirings 342 may be formed on the first insulating layer 330. A second insulating layer 345 covering the horizontal wiring 343 may be formed on the first insulating layer 330. Via holes 344 may be formed in the second insulating layer 345 to expose upper surfaces of the horizontal wiring 343, and vertical wirings 346 may be formed by filling the via holes 344 with a metal.

Pixel electrodes 350 connected to ends of the vertical wirings 346 are formed on the second insulating layer 345. A third insulating layer 355 covering the pixel electrode 350 is formed on the second insulating layer 345. The horizontal wirings 343 and the vertical wirings 342 and 346 between the pixel pads 332 to the pixel electrodes 350 are referred to as a redistribution layer 340. The redistribution layer 340, as described with reference to FIG. 4, connects the pixel pads 332 one-to-one with x-ray measuring points.

In FIG. 5B, the redistribution layer 340 may include one horizontal wiring 343 and two vertical wirings 342 and 346. However, the redistribution layer 340 according to example embodiments is not limited thereto, and, for example, an additional insulating layer (not shown) may further be formed between the second insulating layer 345 and the pixel electrodes 350, and a horizontal wiring and a vertical wiring may further be formed between the vertical wiring 346 and the pixel electrode 350.

Figure 5C:
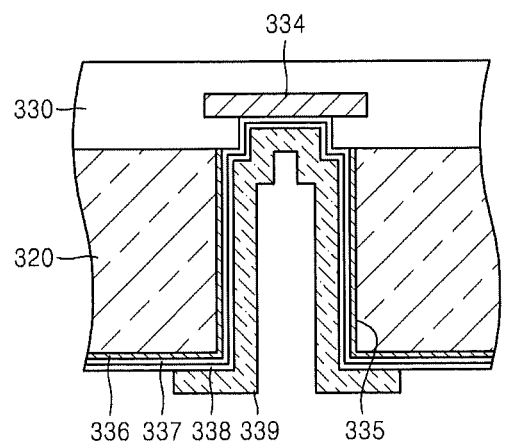

Referring to FIG. 5C, the silicon wafer 320 having a desired thickness may be formed by polishing a lower surface of the silicon wafer 320 by using a chemical mechanical polishing (CMP) method. In FIG. 5C, an upper structure on the first insulating layer 330 is omitted for convenience. Hereinafter, the silicon wafer 320 is also referred to as a seamless silicon substrate 320.

Via holes 335 that expose the pin pads 334 may be formed by dry etching the silicon wafer 320 and the first insulating layer 330 from the lower surface of the silicon wafer 320. Although two pin pads 334 are formed in the cross-sectional view of FIG. 5B, practically the pin pads 334 are formed to correspond to the pixel pads 332, and each of the pin pads 334 is exposed.

In example embodiments, an insulating layer 336 (for example, a silicon oxide layer that is selectively attached to silicon from the lower surface of the silicon wafer 320), a barrier layer 337(for example, a Ti layer formed on the insulating layer 336 and the exposed pin pads 334) may be formed on a bottom surface of the silicon wafer 320 and in the via holes 335. In addition, a seed layer 338, for example, a Cu layer, may be formed on the barrier layer 337.

In example embodiments, a photoresist (not shown) on the lower surface of the silicon wafer 320 may be formed to expose regions for forming via contacts and the via contacts 339 may be formed on the seed layer 338 by using an electroplating method. In example embodiments, the photoresist may be removed and the exposed seed layer 338 and the barrier layer 337 may be removed by etching the lower surface of the silicon wafer 320. The via contacts 339 may be formed of Au, Al, an electrical conductive metal, or an electrical conductive polymer.

Figure 5D:
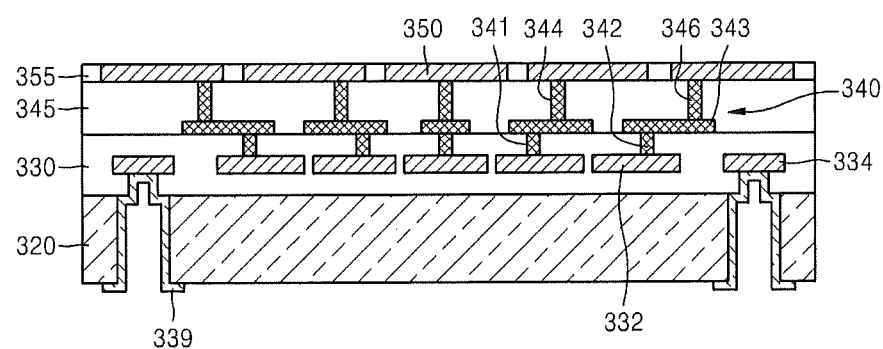

Referring to FIG. 5D, A portion of the third insulating layer 355 on the pixel electrode 350 is removed. In FIG. 5D, the seed layer 338, the barrier layer 337 under the via contacts 339, and the insulating layer 336 are omitted for convenience of description.

Figure 5E:
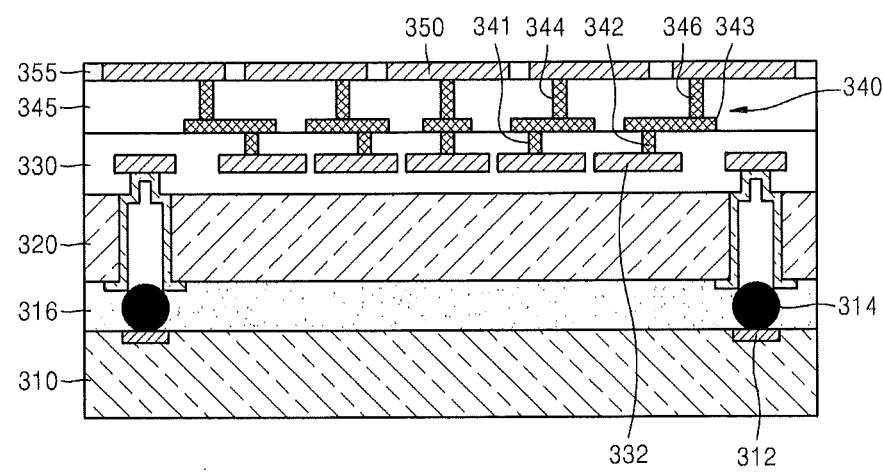

Referring to FIG. 5E, silicon wafers 320 having a square shape may be formed by cutting the silicon wafer 320 as shown in FIG. 2.

A printed circuit substrate 310 on which contacts 312 are formed to correspond to the pin pads 334 may be electrically connected to the via contacts 339 of the silicon wafer 320 using bumps 314, and the bumps 314 may be fixed by filling, a gap between the printed circuit substrate 310 and the silicon wafer 320 with an epoxy resin 316.

Figure 5F:
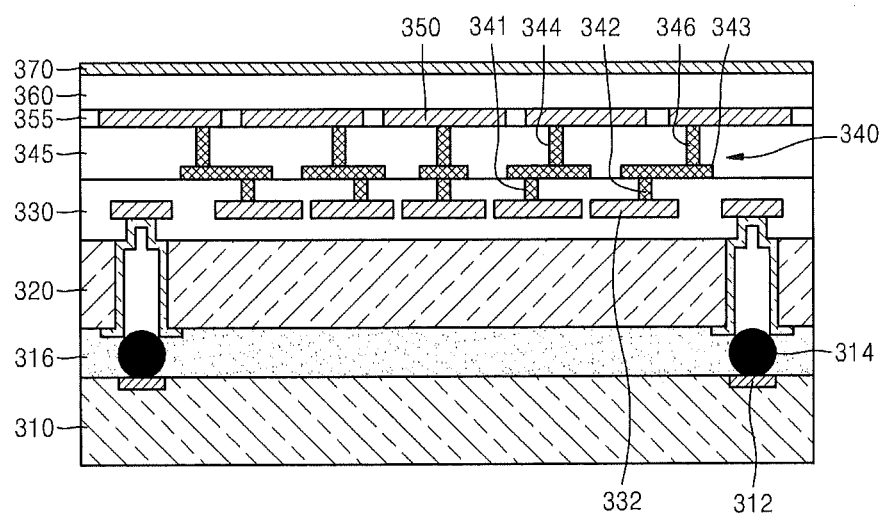

Referring to FIG. 5F, a photoconductor layer 360, which covers the pixel electrodes 350, and a common electrode 370 may be sequentially formed on the third insulating layer 355. The photoconductor layer 360 may be formed of a material selected from the group consisting of a—Se, $HgI_2$, $PbI_2$, CdTe, CdZnTe, and PbO using a sputtering method or an electron beam deposition method. A thickness of the photoconductor layer 360 may vary according to an object to be measured, for example, if the photoconductor layer 360 is formed of $HgI_2$, when a chest is measured, the thickness of the photoconductor layer 360 may be in a range from about 500 μm to about 600 μm, and when a breast is measured, the thickness of the photoconductor layer 360 may be in a range from about 300 μm to about 400 μm. Also, if the photoconductor layer 360 is formed of a—Se, when a chest is measured, the thickness of the photoconductor layer 360 may be in a range from about 900 μm to about 1,000 μm, and when a breast is measured, the thickness of the photoconductor layer 360 may be in a range from about 300 μm to about 400 μm.

The common electrode 370 may be deposited to a thickness in a range from a few hundreds to a few thousands of Å using Al or Cu.

According to the method of manufacturing an x-ray detector according to example embodiments, a large seamless image may be obtained since a wafer-scale chip array is used in the method.

Figure 6A:
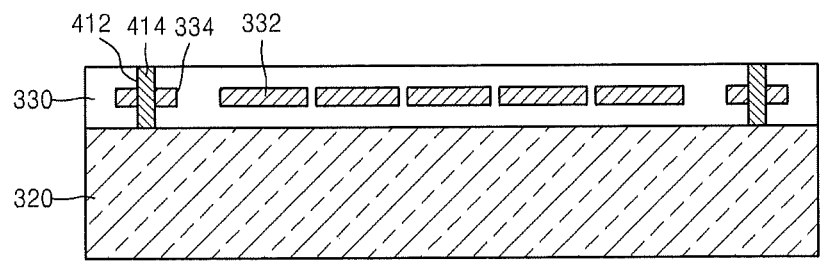
FIGS. 6A through 6C are cross-sectional views for explaining a method of manufacturing an x-ray detector according to example embodiments.
Figure 6B:
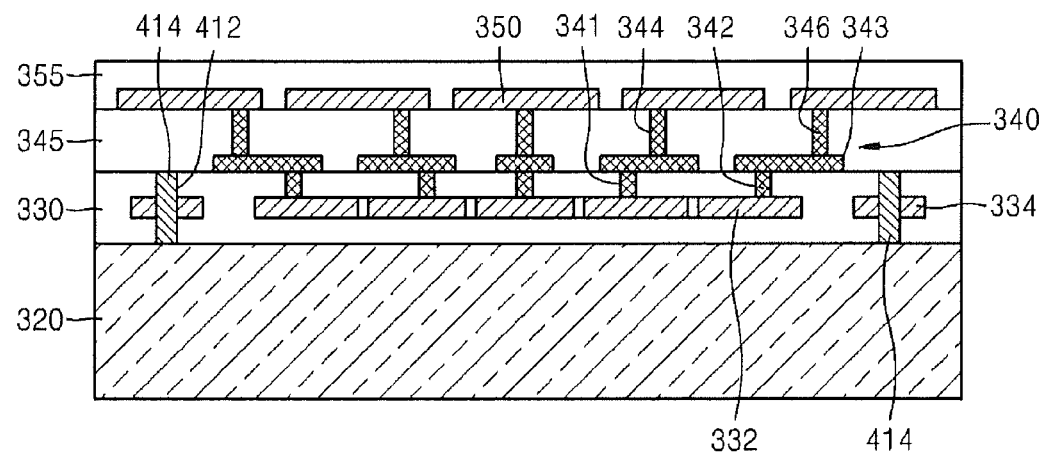
Figure 6C:
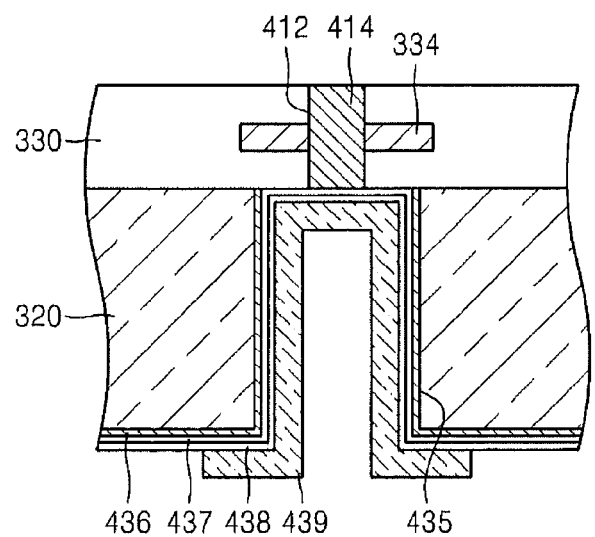

FIGS. 6A through 6C are cross-sectional views for explaining a method of manufacturing an x-ray detector according to example embodiments. Like reference numerals are used to indicate elements that are substantially identical to the elements described above, and thus, the detailed description thereof will not be repeated.

Referring to FIG. 6A, a chip array may be formed on each of the pixel regions A and B (refer to FIG. 1) on the silicon wafer 320. The chip array may includes the pixel pads 332 formed in a central region thereof, the pin pads 334 that surround the pixel pads 332 at the edges thereof, and a first insulating layer 330 that surrounds the pixel pads 332 and the pin pad 334.

In example embodiments, via holes 412 may be formed to penetrate through the pin pads 334 and the first insulating layer 330, and the via holes 412 may be filled with a metal 414.

Referring to FIG. 6B, the redistribution layer 340, the pixel electrodes 350, and the third insulating layer 355 may be formed on the first insulating layer 330.

Referring to FIG. 6C, the silicon wafer 320 may be formed to a desired thickness by polishing the lower surface of the silicon wafer 320 by using a CMP method. In FIG. 6, an upper structure on the first insulating layer 330 is omitted for convenience.

In example embodiments, via holes 435 that expose the metal 414 may be formed by dry etching the silicon wafer 320 from a lower surface of the silicon wafer 320. In example embodiments, an insulating layer 436 (for example, a silicon oxide layer that is selectively attached to silicon on the lower surface of the silicon wafer 320), a barrier layer 437 (for example, a Ti layer is formed on the insulating layer 436 and the exposed metal 414), and a seed layer 438 (for example, a Cu layer is formed on the barrier layer 437) may be formed on a bottom surface of the silicon wafer 320 and in the via holes 435.

In example embodiments, a photoresist (not shown) exposing a region for forming contacts on the lower surface of the silicon wafer 320 may be formed and via contacts 439 may be formed on the seed layer 438 by using an electroplating method. In example embodiments, the photoresist may be removed. In example embodiments the seed layer 438 and the barrier layer 437 may likewise removed. For example, the seed layer 438 and the barrier layer 437 may be removed by etching the lower surface of the silicon wafer 320. The via contacts 439 may be formed of Au or Al, and may be electrically connected to the metal 414 formed through the pin pads 334.

The remaining processes may be the same as the processes described with reference to FIGS. 5D through 5F, and thus, will not be repeated.

In the wafer-scale x-ray detector according to example embodiments, charges generated in a photoconductor on a seam region between chip regions may be transferred to a wafer-scale chip array through a pixel electrode formed under the photoconductor. Therefore, a seamless image in an imaging field can be correctly realized.

It should be understood that example embodiments as described herein should be considered in a descriptive sense only and not for purposes of limitation. Descriptions of features or aspects within example embodiments should typically be considered as available for other similar features or aspects in other embodiments.

What is claimed is:
1. A wafer-scale x-ray detector comprising:
a seamless silicon substrate;
a first plurality of pixel pads and a first plurality of pin pads on a first surface of the seamless silicon substrate, the first plurality of pixel pads and the first plurality of pin pads defining a first chip region;
a second plurality of pixel pads and a second plurality of pin pads on the first surface of the seamless silicon substrate, the second plurality of pixel pads and the second plurality of pin pads defining a second chip region;

a photoconductor layer on the first and second pluralities of pixel pads and the first and second pluralities of pin pads;

a plurality of pixel electrodes between the photoconductor layer and the first and second pluralities of pixel pads and between the photoconductor layer and the first and second pluralities of pin pads;

a printed circuit substrate on a second surface of the seamless silicon substrate; and a common electrode on the photoconductor layer on which x-rays are irradiated.

2. The wafer-scale x-ray detector of claim 1, further comprising:

a redistribution layer electrically connecting the first and second pluralities of pixel pads to the plurality of pixel electrodes.

3. The wafer-scale x-ray detector of claim 2, wherein the redistribution layer comprises at least one insulating layer, vertical wirings penetrating the at least one insulating layer, and horizontal wirings.

4. The wafer-scale x-ray detector of claim 1, wherein a first group of pixel electrodes from among the plurality of pixel electrodes corresponds to the first plurality of the pixel pads and a second group of pixel electrodes from among the plurality of pixel electrodes corresponds to the second plurality of pixel pads and areas covered by the first and second groups of pixel electrodes is greater than areas covered by the first and second pluralities of the pixel pads.

5. The wafer-scale x-ray detector of claim 1, wherein
the first and second pluralities of pin pads surround the first and second pluralities of the pixel pads, respectively, and
the first and second pluralities of the pin pads are electrically connected to the first and second pluralities of pixel pads, respectively.

6. The wafer-scale x-ray detector of claim 5, wherein the seamless silicon substrate includes a plurality of via holes and a plurality of via contacts on the plurality of the via holes, and the first and second pluralities of pin pads are electrically connected to the printed circuit substrate through a corresponding via contact.

7. The wafer-scale x-ray detector of claim 6, further comprising:

bumps between the via contacts and the printed circuit substrate, wherein the bumps electrically connect the via contacts and the printed circuit substrate.

8. The wafer-scale x-ray detector of claim 5, wherein the seamless silicon substrate includes a plurality of via holes and a plurality of via contacts on the plurality of via holes, and each via contact is electrically connected to a metal formed through a respective pin pad of the first and second pluralities of pin pads.

9. The wafer-scale x-ray detector of claim 1, wherein the printed circuit substrate is a single printed circuit substrate, and the single printed circuit substrate is disposed to correspond to the first and second chip regions.

10. The wafer-scale x-ray detector of claim 1, wherein the printed circuit substrate comprises a plurality of printed circuit substrates, and each of the plurality of the printed circuit substrates is disposed in a one-to-one correspondence with each chip region.

11. The wafer-scale x-ray detector of claim 1, further comprising:

a resin in a gap between the seamless silicon substrate and the printed circuit substrate.

12. The wafer-scale x-ray detector of claim 1, wherein the seamless silicon substrate is comprised of a mono-crystalline silicon.

13. The wafer-scale x-ray detector of claim 1, wherein the photoconductor layer includes at least one of amorphous selenium (a—Se), $HgI_2$, $PbI_2$, CdTe, CdZnTe, and PbO.

14. The wafer-scale x-ray detector of claim 1, wherein the photoconductor layer is configured to generate charges according to an intensity of the x-ray.

15. A method of manufacturing an x-ray detector, the method comprising:

forming a plurality of chip regions each having a plurality of pixel pads and a plurality of pin pads on a first surface of a seamless silicon substrate;

forming a plurality of first via holes through the seamless silicon substrate to expose the pluralities of pin pads;

bonding a printed circuit substrate on a second surface of the seamless silicon substrate by electrically connecting the pluralities of pin pads to the printed circuit substrate through the plurality of first via holes; and sequentially forming pixel electrodes electrically connected to the pluralities of pixel pads, a photoconductor layer on the pixel electrodes, and a common electrode on the photoconductor layer.

16. The method of claim 15, further comprising:

forming a redistribution layer between the pixel electrodes and the pluralities of pixel pads that electrically connects the pluralities of pixel pads to the pixel electrodes.

17. The method of claim 16, wherein the forming of the redistribution layer comprises:

forming a first insulating layer that comprises first vertical wirings that contact the pluralities of pixel pads; and forming a second insulating layer on the first insulating layer, the second insulating layer comprising horizontal wirings and second vertical wirings that expand an area of the pluralities of pixel pads to an area of the pixel electrodes.

18. The method of claim 17, wherein forming the first insulating layer comprises:

forming the first insulating layer on the pluralities of pixel pads;

forming a plurality of second via holes in the first insulating layer to expose the pluralities pixel pads; and forming the first vertical wirings by filling the plurality of second via holes with a metal.

19. The method of claim 17, wherein forming the second insulating layer comprises:

forming the horizontal wirings on the first insulating layer, the horizontal wirings being formed to be connected to the first vertical wirings;

forming the second insulating layer on the first insulating layer and the horizontal wirings;

forming a plurality of third via holes in the second insulating layer to expose the horizontal wirings; and forming the second vertical wirings by filling the plurality of third via holes with a metal.

20. The method of claim 15, wherein bonding the printed circuit substrate comprises bonding the printed circuit substrate on the second surface of the seamless silicon substrate after forming via contacts on the plurality of first via holes.

21. The method of claim 20, wherein forming the contacts includes forming an insulation layer on the second surface of the seamless silicon substrate, forming a barrier layer on the insulation layer, forming a seed layer on the barrier layer, and forming a metal layer on the seed layer.

22. The method of claim 20, further comprising:
forming bumps between the via contacts and the printed circuit substrate after forming the via contacts and before bonding the printed circuit substrate, wherein the via contacts are connected to the printed circuit substrate through the bumps.

23. The method of claim 22, wherein the printed circuit substrate is a single printed circuit substrate corresponding to the plurality of the chip regions.

24. The method of claim 15, wherein the printed circuit substrate comprises a plurality of printed circuit substrates disposed in a one-to-one correspondence with each of the plurality of the chip regions.

25. The method of claim 15, wherein the seamless silicon substrate is a mono-crystalline silicon substrate.

26. The method of claim 15, wherein the photoconductor layer is formed of at least one material selected from the group consisting of a—Se, $HgI_2$, $PbI_2$, CdTe, CdZnTe, and PbO.

27. The method of claim 15, wherein the plurality of pin pads in each chip region enclose their respective plurality of pixel pads.

28. The method of claim 15, wherein the plurality of pin pads in each chip region are formed with a metal wire passing therethrough.

29. The method of claim 15, wherein the photoconductor layer is configured to generate charges according to an intensity of an x-ray inputted to it.

\* \* \* \* \*